United States Patent [19]
Pearey et al.

[11] Patent Number: 5,200,359
[45] Date of Patent: Apr. 6, 1993

[54] METHOD OF DECREASING CONTACT RESISTANCE BETWEEN A LOWER ELEVATION ALUMINUM LAYER AND A HIGHER ELEVATION ELECTRICALLY CONDUCTIVE LAYER

[75] Inventors: Leslie A. Pearey; Timothy P. O'Brien; John E. Knudson; Thomas N. Melody; Russell C. Zahorik, all of Boise, Id.

[73] Assignee: Micron Technology, Inc., Boise, Id.

[21] Appl. No.: 771,399

[22] Filed: Oct. 3, 1991

[51] Int. Cl.$^5$ ............................ H01L 21/441
[52] U.S. Cl. ............................ 437/192; 437/194; 437/195
[58] Field of Search ............ 437/192, 194, 190, 195

[56] References Cited

U.S. PATENT DOCUMENTS

| | | | |
|---|---|---|---|
| 4,673,623 | 6/1987 | Gardner et al. | 428/620 |
| 4,937,652 | 6/1990 | Okumura et al. | 357/68 |
| 5,081,064 | 1/1992 | Inoue et al. | 437/194 X |

Primary Examiner—John S. Maples
Attorney, Agent, or Firm—Wells, St. John, Roberts, Gregory & Matkin

[57] ABSTRACT

A semiconductor processing method for decreasing electrical contact resistance between different elevation electrically conductive layers is disclosed. The method includes applying an aluminum layer atop a partially processed semiconductor wafer, with the aluminum layer having a defined upper surface. The semiconductor wafer with applied aluminum layer is exposed to an oxidizing atmosphere, forming an electrically resistive aluminum oxide at the upper surface of the aluminum layer. An interlayer insulating dielectric material is applied atop the aluminum layer. It is selectively patterned and etched to define a contact opening to the aluminum layer. A layer of titanium metal is applied atop the patterned and etched interlayer dielectric to a preselected thickness. The titanium metal contacts the upper aluminum oxide surface of the aluminum layer within the contact opening. The titanium metal is reacted with the aluminum oxide in the contact to transform aluminum oxide into a less electrically resistive titanium oxide. After application of the titanium metal, a layer of conductive material is applied atop the wafer and thereafter selectively patterned and etched to form a desired the conductive runner.

21 Claims, 4 Drawing Sheets

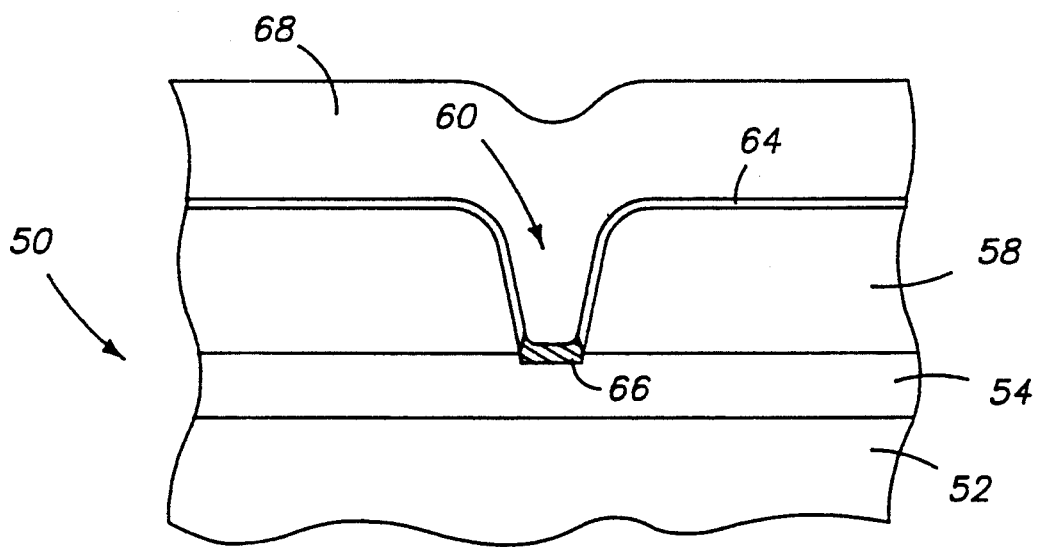
FIG 9A
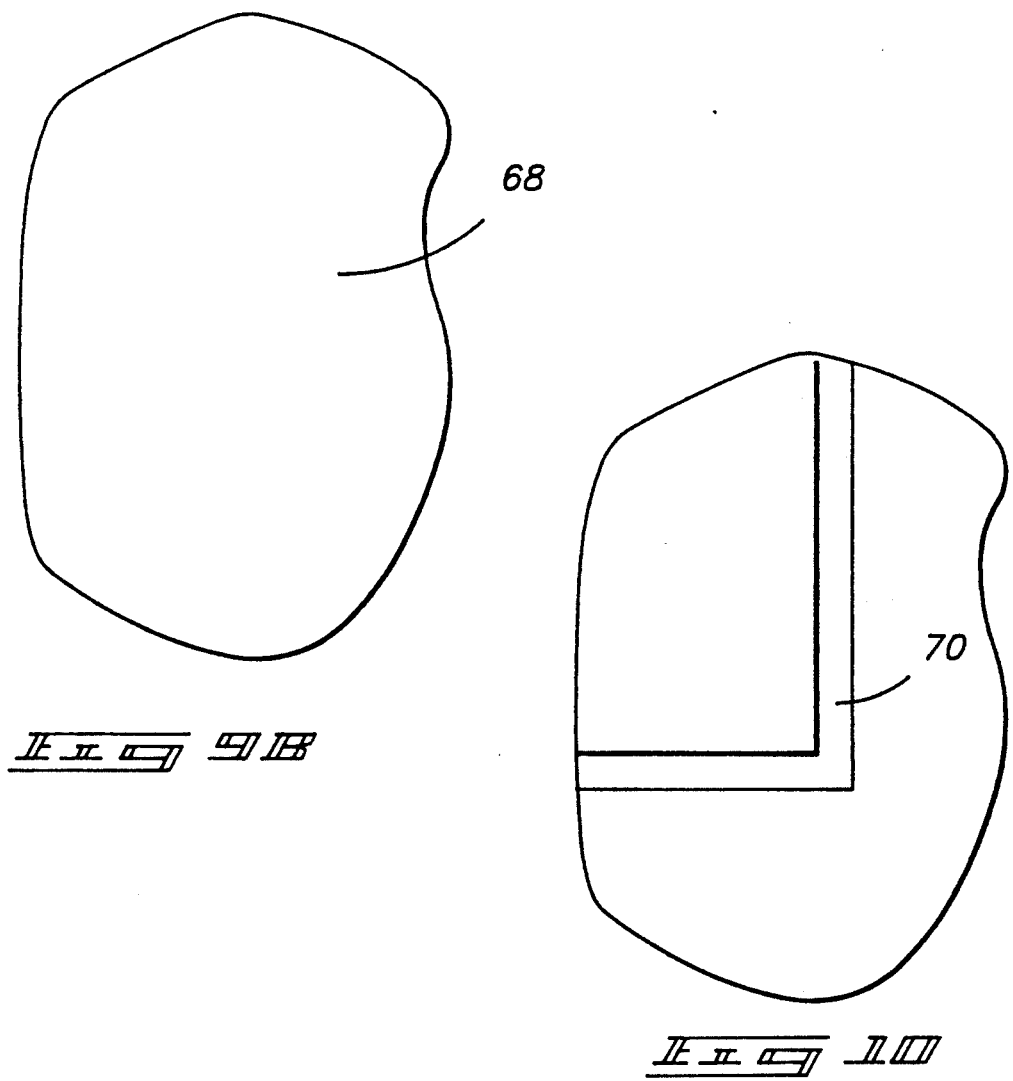
FIG 9B
FIG 10

METHOD OF DECREASING CONTACT RESISTANCE BETWEEN A LOWER ELEVATION ALUMINUM LAYER AND A HIGHER ELEVATION ELECTRICALLY CONDUCTIVE LAYER

TECHNICAL FIELD

This invention relates generally to semiconductor processing methods for making electrical contact between different elevation electrically conductive layers formed on a semiconductor wafer, where the lower layer comprises aluminum.

BACKGROUND OF THE INVENTION

Integrated circuits are chemically and physically integrated into a substrate, such as a silicon wafer, by patterning regions in the substrate and by patterning layers on the substrate. These regions and layers can be conductive, for conductor and resistor fabrication. They can also be of different conductivity types, which is essential for transistor and diode fabrication.

Deposited conductors are an integral part of every integrated circuit, and provide the role of wiring for conductive current. Specifically, the deposited conductors are used to wire together the various components that are formed on and in the surface of the wafer. Such conductors, also referred to as "lines" or "runners", are typically provided at different elevations within the wafer structure. At some locations, it may become necessary to make electrical contact between higher and lower elevation conductive lines on the wafer. This invention concerns a problem associated with making electrical contact between two different elevation conductive layers, where the lower elevation layer includes aluminum.

Aluminum is a common material used for the metal conductive runner layers due in large part to the ease with which it can be worked, and due to its high conductivity. Most commonly, the aluminum materials utilized for conductive runners are alloys of aluminum comprising, for example, 1% silicon and 0.5% copper, with the remaining fraction being essentially elemental aluminum. The resistivity of such a material is only 3 microohms-cm, thereby providing excellent conductivity.

However, one drawback is that aluminum and its alloys readily form aluminum oxide ($Al_2O_3$) when subjected to an oxidizing atmosphere, such as air. $Al_2O_3$ is a highly insulative material having a resistivity of $3.5 \times 10^{14}$ microohms-cm. The spontaneous formation of $Al_2O_3$ can cause problems in metallization procedures which are described with reference to FIGS. 1-3.

FIG. 1 diagrammatically illustrates a cross-section of a portion of a semiconductor wafer fragment 10 having an insulating dielectric portion 12 and overlying aluminum metal layer 14. A second layer of dielectric material 16 has been applied and patterned to form a contact opening 18. During application of dielectric 16, or subsequent thereto, wafer fragment 10 is exposed to an oxidizing atmosphere which transforms the upper surface of the aluminum layer 14 through contact opening 18 into the highly electrically insulative $Al_2O_3$, as represented by numeral 20. The $Al_2O_3$ region 20 which grows on top of layer 14 might consume perhaps about 100 Angstroms of the thickness of layer 14, as compared to a typical thickness of aluminum layer 14 of about 10,000 angstroms. The relative thickness of region 20 in the figures compared to the thickness of layer 14 is exaggerated for clarity of viewing region 20.

Where the wafer is exposed to an oxidizing atmosphere before or during application of dielectric layer 16, the $Al_2O_3$ region would typically form entirely across the upper surface of aluminum layer 14. This would not create a significant problem throughout the runner as only the upper 30 to 40 Angstroms of this 10,000 Angstrom thick metal layer would be transformed into an insulating material. There is still ample material for conveying current along the runner.

However, the $Al_2O_3$ of region 20 within contact opening 18 produces an insulative barrier to electrical contact between metal layer 14 (sometimes referred to as Metal 1) and a subsequently applied conductive layer (sometimes referred to as Metal 2). FIG. 2 illustrates a second metal layer 22 applied atop dielectric 16 which fills contact opening 18. Insulating $Al_2O_3$ region 20 prevents the desired electrical contact between Metal 2 layer 22 and Metal 1 layer 14. Such would result in a failed circuit.

In an effort to alleviate the above described problem, the present state of the art typically conducts a radio frequency (RF) induced plasma etch in a non-oxidizing atmosphere before application of second metal layer 22 in an effort to completely remove $Al_2O_3$ region 20 from contact opening 18. Such adds another time consuming step to the overall process, and is not 100% reliable. For example, the RF etch may not be effective in removing any of $Al_2O_3$ region 20, or may only remove a fraction thereof. Such is insufficient to enable an acceptable conductive contact to be made between Metal 2 layer 22 and Metal 1 layer 14. FIG. 3 illustrates an $Al_2O_3$ region 20a which was reduced in size from the FIGS. 1 and 2 region 20 by an RF etch, but yet not sufficiently to be completely removed thereby still leaving a resistive barrier between metal two layer 22 and aluminum metal layer 14.

It would be desirable to overcome these and other drawbacks associated with electrical contact resistance which occurs between an underlying aluminum layer and an overlying conductive layer making contact thereto.

BRIEF DESCRIPTION OF THE DRAWINGS

Preferred embodiments of the invention are described below with reference to the accompanying drawings.

FIG. 9A is a diagrammatic section view of the FIG. 4 wafer fragment illustrated at a processing step subsequent to that shown by FIG. 8.

FIG. 9B is a top view of the FIG. 9A wafer.

FIG. 10 is a top view of the FIG. 4 wafer corresponding to the FIG. 9B view but at a processing step subsequent to that illustrated by FIG. 9B.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with the invention, a semiconductor processing method for decreasing electrical contact resistance between different elevation electrically conductive layers comprises the following steps:

applying an aluminum layer atop a partially processed semiconductor wafer, the aluminum layer having an upper surface;

exposing the semiconductor wafer with applied aluminum layer to an oxidizing atmosphere and forming an electrically resistive aluminum oxide at the upper surface of the aluminum layer;

applying an interlayer insulating dielectric material atop the aluminum layer;

selectively patterning and etching the interlayer dielectric to define a contact opening to the aluminum layer;

applying a layer of titanium metal atop the patterned and etched interlayer dielectric to a preselected thickness, the titanium metal contacting the upper aluminum oxide surface of the aluminum layer within the contact opening;

reacting the titanium metal with the aluminum oxide in the contact to transform aluminum oxide into a less electrically resistive titanium oxide; and after application of the titanium metal, applying a layer of conductive material atop the wafer and thereafter selectively patterning and etching the conductive layer.

Figure 1:
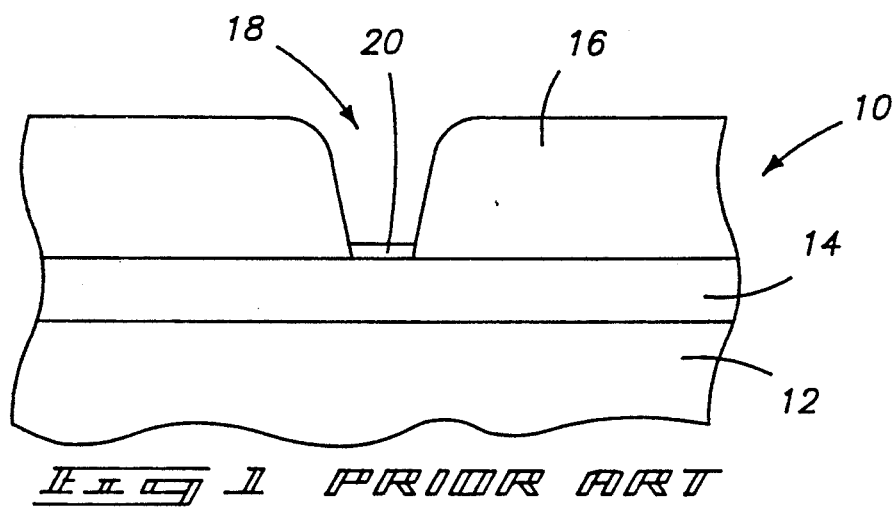
FIG. 1 is a diagrammatic section view of a portion of a wafer fragment processed in accordance with the prior art, and is discussed in the "Background" section above.
Figure 2:
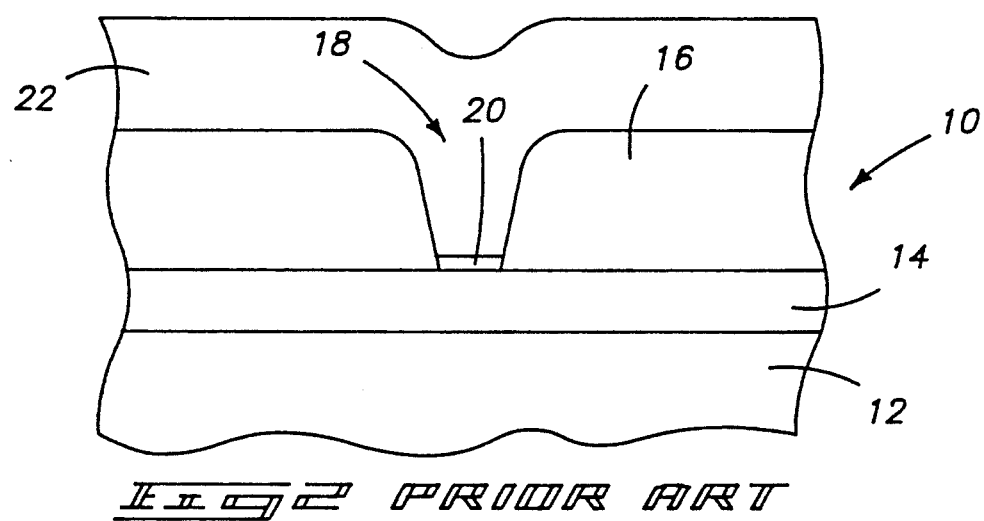
FIG. 2 is a diagrammatic section view of the FIG. 1 wafer fragment illustrated at a prior art processing step subsequent to that shown by FIG. 1, and is discussed in the "Background" section above.
Figure 3:
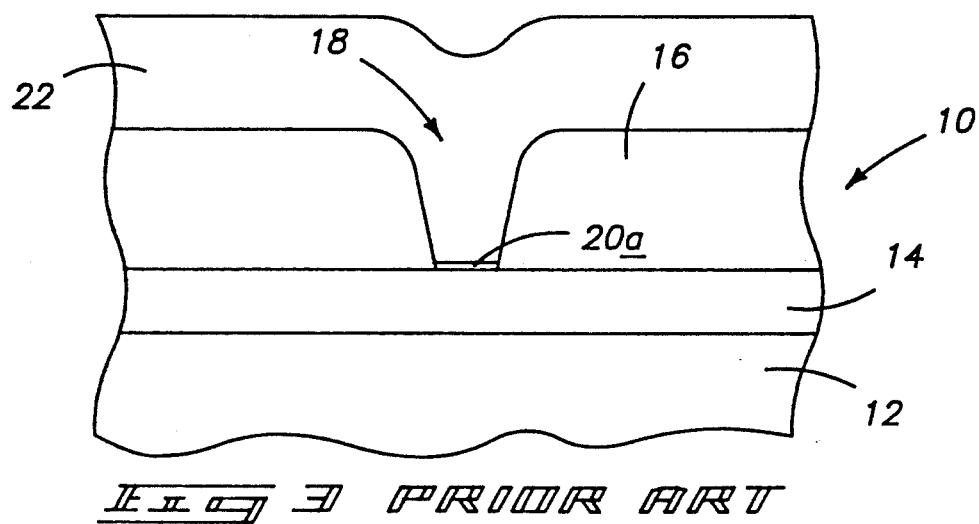
FIG. 3 is a diagrammatic section view of the FIG. 1 wafer fragment illustrated at a prior art processing step subsequent to that shown by FIG. 2, and is discussed in the "Background" section above.
Figure 4:
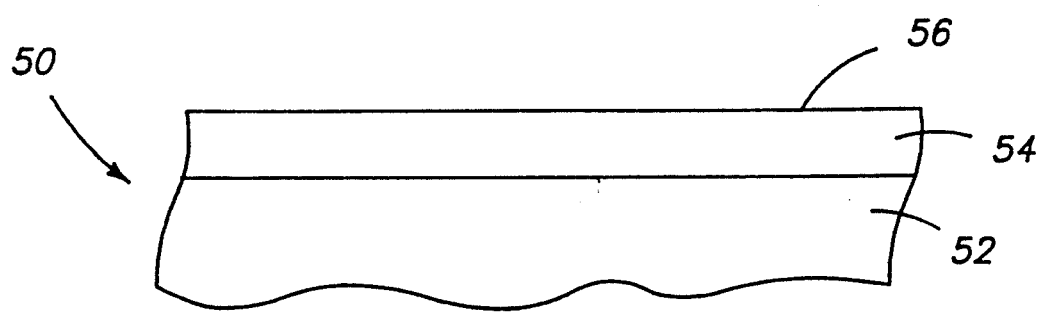
FIG. 4 is a diagrammatic section view of a portion of a wafer fragment at a processing step in accordance with the invention.

More particularly and with reference to the figures, FIG. 4 illustrates a partially processed semiconductor wafer 50 having a dielectric region 52. An aluminum layer 54 is applied atop region 52, defining an upper aluminum surface 56. Aluminum layer 54 preferably consists essentially of an aluminum alloy, such as 98.5% Al, 1% Si, and 0.5% Cu, which is sputter deposited atop dielectric 52 by known techniques. A typical thickness would be 10,000 Angstroms.

Figure 5:
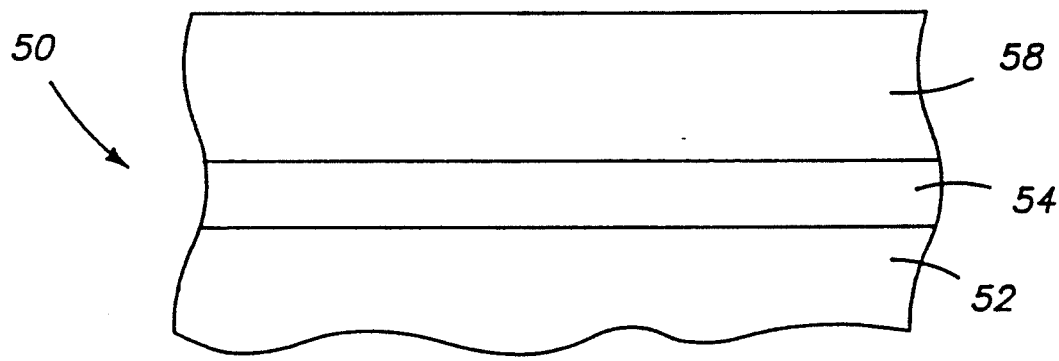
FIG. 5 is a diagrammatic section view of the FIG. 4 wafer fragment illustrated at a processing step subsequent to that shown by FIG. 4.

Referring to FIG. 5, an interlayer 58 of insulating dielectric material is applied over upper surface 56 of aluminum layer 54. Such material would typically be $SiO_2$, applied to a typical thickness of 20,000 Angstroms.

Figure 6:
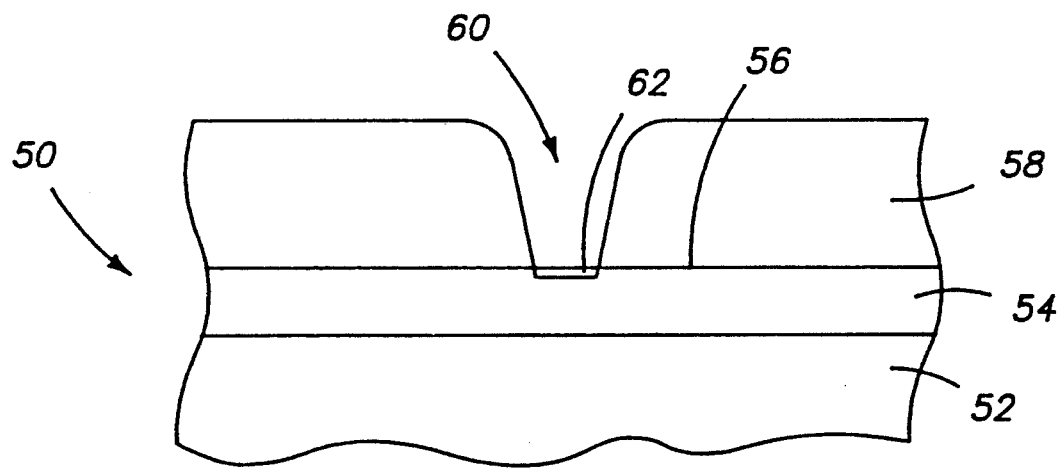
FIG. 6 is a diagrammatic section view of the FIG. 4 wafer fragment illustrated at a processing step subsequent to that shown by FIG. 5.

Referring to FIG. 6, dielectric layer 58 is selectively patterned and etched to define a contact opening 60 to underlying aluminum layer 54. Either during or subsequent to application and etching of layer 58, the wafer with aluminum layer 54 thereapplied is exposed to oxidizing conditions. This forms an $Al_2O_3$ region 62 at upper surface 56 of aluminum layer 54. If aluminum layer 54 is not subjected to oxidizing conditions until after application and etch of layer 58, the $Al_2O_3$ region formed will only occur at the upper surface 56 of aluminum layer 54 within contact opening 60. If aluminum layer 54 is exposed to oxidizing conditions before or during application of layer 58, the $Al_2O_3$ region would typically form over the entire upper surface 56 of aluminum layer 54. The $Al_2O_3$ region formed will typically have an overall thickness of approximately 30–40 Angstroms. Mere exposure of layer 54 to ambient atmosphere will cause such a $Al_2O_3$ to form.

Figure 7:
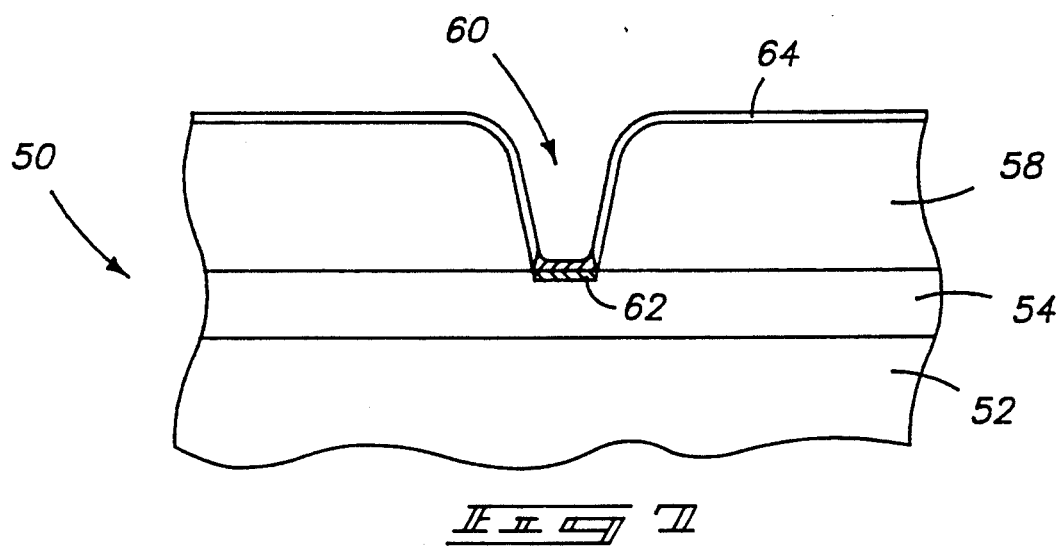
FIG. 7 is a diagrammatic section view of the FIG. 4 wafer fragment illustrated at a processing step subsequent to that shown by FIG. 6.

Referring to FIG. 7, a layer 64 of titanium metal is applied atop the patterned and etched interlayer dielectric 58 to a preselected thickness which is preferably from about 100 Angstroms to about 1000 Angstroms, with about 300 Angstroms being most preferred. Titanium metal layer 64 contacts the upper surface of oxide region 62 within contact opening 60. Titanium layer 64 preferably consists essentially of elemental titanium. Such can be applied by conventional techniques such as sputter deposition at about 250° C.

Figure 8:
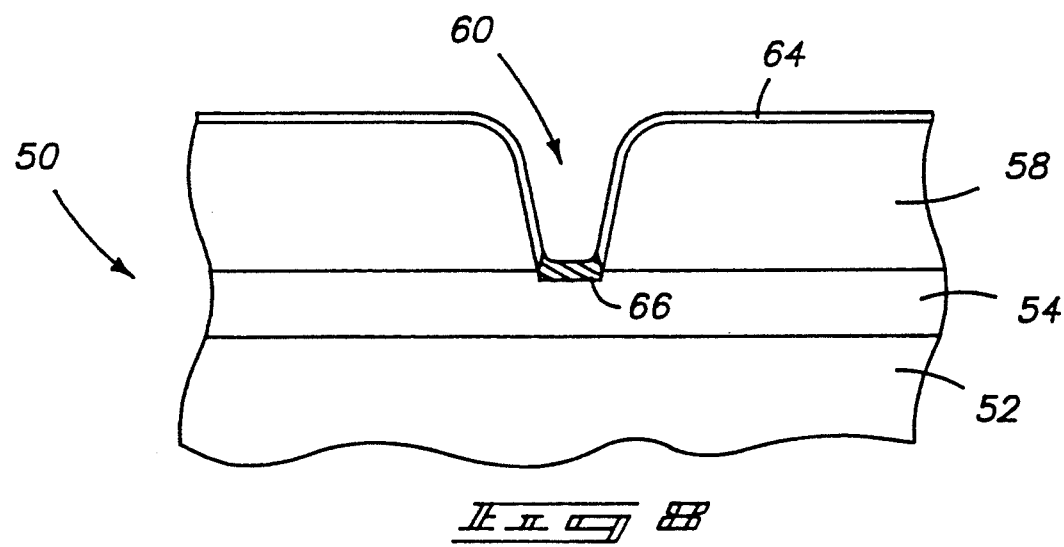
FIG. 8 is a diagrammatic section view of the FIG. 4 wafer fragment illustrated at a processing step subsequent to that shown by FIG. 7.

Referring to FIG. 8, titanium metal of layer 64 in contact with $Al_2O_3$ region 60 is reacted with the $Al_2O_3$ to transform $Al_2O_3$ into a less electrically resistive titanium oxide region 66. The titanium oxide formed will predominantly be $TiO_2$. Typically, the reacting of titanium from layer 64 will occur almost simultaneously upon contact of titanium with region 60 during application of layer 64 at the typical deposition temperature of 250° C. Such temperatures are sufficient to cause the $Al_2O_3$ to react to form the predominant titanium oxide species of $TiO_2$. The predominant titanium oxide specie of $TiO_2$ has an electrical resistivity which is approximately $1.2 \times 10^{10}$ microohms-cm, which is approximately thirty thousand (30,000) times less resistive than is $Al_2O_3$.

Referring to FIGS. 9A and 9B, a layer 68 of conductive material is applied atop titanium layer 64 to fill contact opening 60. Referring to FIG. 10, layer 68 is thereafter selectively patterned and etched to define some desired pattern of a conductive runner 70, as illustrated. During such patterning, titanium layer 64 would also be patterned and etched downward to dielectric layer 58. Regardless, a subsequent dielectric layer would be applied atop patterned runner 70 and remainder of the wafer for electric isolation. The preferred material for second conductive 68 comprises aluminum, with an aluminum alloy such as described above being most preferred. A typical thickness would be 10,000 Angstroms (1 micron).

The above described method results in a 30,000 fold decrease in contact resistance between Metal 1 layer 54 and Metal 2 layer 68 over the above described prior art technique which invariably leaves some $Al_2O_3$ within contact opening 60. Such will enable electrical contact between Metal 1 and Metal 2 layers which otherwise might not occur if sufficient $Al_2O_3$ were present between the layers.

As an additional step to the above described method, a radio frequency induced plasma etch could be conducted in a non-oxidizing atmosphere after patterning and etching dielectric interlayer 58 to etch some of $Al_2O_3$ region 62 away from upper surface 56 of aluminum layer 54 within contact opening 60. This would enable creation of a smaller amount of titanium oxide ultimately between aluminum layer 54 and upper metal layer 68 thereby further reducing the resistance between layers 54 and 68. Although titanium oxide is considerably less resistive (on the order of 30,000) than Al$_2$O$_3$, it is still more resistive than either of the materials of layers 54 and 68.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method for decreasing electrical contact resistance between different elevation electrically conductive layers, the method comprising the following steps:
    applying an aluminum layer atop a partially processed semiconductor wafer, the aluminum layer having an upper surface;
    exposing the semiconductor wafer with applied aluminum layer to an oxidizing atmosphere and forming an electrically resistive aluminum oxide at the upper surface of the aluminum layer;
    applying an interlayer insulating dielectric material atop the aluminum layer;
    selectively patterning and etching the interlayer dielectric to define a contact opening to the aluminum layer;
    applying a layer of titanium metal atop the patterned and etched interlayer dielectric, the titanium metal contacting the upper aluminum oxide surface of the aluminum layer within the contact opening;
    reacting the titanium metal with the aluminum oxide in the contact to transform aluminum oxide into a less electrically resistive titanium oxide; and
    after application of the titanium metal and reaction to form a titanium oxide, applying a layer of conductive material atop the wafer over the titanium oxide, and thereafter selectively patterning and etching the conductive layer.

2. The semiconductor processing method of claim 1 wherein the layer of titanium metal is applied to a thickness of from about 100 Angstroms to about 1000 Angstroms.

3. The semiconductor processing method of claim 1 wherein the layer of titanium metal is applied to a thickness of about 300 Angstroms.

4. The semiconductor processing method of claim 1 wherein the titanium metal being applied consists essentially of elemental titanium.

5. The semiconductor processing method of claim 1 wherein the reacting of the titanium with the aluminum oxide occurs during the step of applying the layer of titanium metal atop the patterned and etched interlayer dielectric.

6. The semiconductor processing method of claim 1 further comprising conducting a radio frequency induced plasma etch in a non-oxidizing atmosphere after patterning and etching the interlayer dielectric to etch some of the aluminum oxide away from the upper surface of the aluminum layer within the contact opening.

7. The semiconductor processing method of claim 1 wherein the aluminum layer comprises an aluminum alloy.

8. The semiconductor processing method of claim 1 wherein the layer of titanium metal is applied to a thickness of from about 100 Angstroms to about 1000 Angstroms, and the reacting of the titanium with the aluminum oxide occurs during the step of applying the layer of titanium metal atop the patterned and etched interlayer dielectric.

9. The semiconductor processing method of claim 1 wherein the layer of titanium metal is applied to a thickness of from about 100 Angstroms to about 1000 Angstroms, and further comprising:
    conducting a radio frequency induced plasma etch in a non-oxidizing atmosphere after patterning and etching the interlayer dielectric to etch some of the aluminum oxide away from the upper surface of the aluminum layer within the contact opening.

10. The semiconductor processing method of claim 1 wherein the reacting of the titanium with the aluminum oxide occurs during the step of applying the layer of titanium metal atop the patterned and etched interlayer dielectric, and further comprising:
    conducting a radio frequency induced plasma etch in a non-oxidizing atmosphere after patterning and etching the interlayer dielectric to etch some of the aluminum oxide away from the upper surface of the aluminum layer within the contact opening.

11. The semiconductor processing method of claim 1 wherein,
    the layer of titanium metal is applied to a thickness of from about 100 Angstroms to about 1000 Angstroms;
    the reacting of the titanium with the aluminum oxide occurs during the step of applying the layer of titanium metal atop the patterned and etched interlayer dielectric; and further comprising:
    conducting a radio frequency induced plasma etch in a nonoxidizing atmosphere after patterning and etchng the interlayer dielectric to etch some of the aluminum oxide away from the upper surface of the aluminum layer within the contact opening.

12. The semiconductor processing method of claim 1 wherein the layer of titanium metal is applied to a thickness of from about 100 Angstroms to about 1000 Angstroms, and the titanium metal being applied consists essentially of elemental titanium.

13. The semiconductor processing method of claim 1 wherein the titanium metal being applied consists essentially of elemental titanium, and the reacting of the titanium with the aluminum oxide occurs during the step of applying the layer of titanium metal atop the patterned and etched interlayer dielectric.

14. The semiconductor processing method of claim 1 wherein the titanium metal being applied consists essentially of elemental titanium, and further comprising:
    conducting a radio frequency induced plasma etch in a monoxidizing atmosphere after patterning and etching the interlayer dielectric to etch some of the aluminum oxide away from the upper surface of the aluminum layer within the contact opening.

15. The semiconductor processing method of claim 1 wherein,
    the layer of titanium metal is applied to a thickness of from about 100 Angstroms to about 1000 Angstroms;

the titanium metal being applied consists essentially of elemental titanium, and further comprising:

conducting a radio frequency induced plasma etch in a monoxidizing atmosphere after patterning and etching the interlayer dielectric to etch some of the aluminum oxide away from the upper surface of the aluminum layer within the contact opening.

16. A semiconductor processing method for decreasing electrical contact resistance between different elevation electrically conductive layers, the method comprising the following steps:

applying a layer of aluminum alloy atop a partially processed semiconductor wafer, the aluminum alloy layer having an upper surface;

exposing the semiconductor wafer with applied aluminum alloy layer to an oxidizing atmosphere and forming aluminum oxide at the upper surface of the aluminum alloy layer;

applying an interlayer insulating dielectric material atop the aluminum alloy layer;

selectively patterning and etching the interlayer dielectric to define a contact opening to the aluminum alloy layer;

applying a layer of elemental titanium atop the patterned and etched interlayer dielectric to a thickness of from about 100 Angstroms to about 1000 Angstroms, the elemental titanium contacting the upper aluminum oxide surface of the aluminum alloy layer within the contact opening;

reacting the titanium metal with the aluminum oxide in the contact to transform aluminum oxide into a less resistive titanium oxide, the reacting of the elemental titanium with the aluminum oxide occurring during the step of applying the layer of titanium metal atop the patterned and etched interlayer dielectric; and after application of the elemental titanium metal and reaction to form titanium oxide, applying a layer of conductive material atop the wafer over the titanium oxide and thereafter selectively patterning and etching the conductive layer.

17. The semiconductor processing method of claim 16 wherein the thickness of the elemental titanium is about 300 Angstroms.

18. The semiconductor processing method of claim 16 wherein the conductive material comprises aluminum.

19. The semiconductor processing method of claim 18 wherein the thickness of the elemental titanium is about 300 Angstroms.

20. The semiconductor processing method of claim 16 wherein the conductive material comprises an aluminum alloy.

21. The semiconductor processing method of claim 20 wherein the thickness of the elemental titanium is about 300 Angstroms.

* * * * *